United States Patent
Tanaka et al.

(10) Patent No.: US 7,292,047 B2
(45) Date of Patent: Nov. 6, 2007

(54) HIGH-FREQUENCY POWER SOURCE

(75) Inventors: Ryohei Tanaka, Osaka (JP); Hiroshi Matoba, Osaka (JP)

(73) Assignee: Daihen Corporation, Osaka (JP)

( * ) Notice: Subject to any disclaimer, the term of this patent is extended or adjusted under 35 U.S.C. 154(b) by 0 days.

(21) Appl. No.: 11/391,115

(22) Filed: Mar. 28, 2006

(65) Prior Publication Data

US 2006/0220656 A1 Oct. 5, 2006

(30) Foreign Application Priority Data

Mar. 31, 2005 (JP) ............................. 2005-101593

(51) Int. Cl.
*G01R 27/00* (2006.01)

(52) U.S. Cl. .................. 324/600; 324/642; 324/76.11; 324/76.19

(58) Field of Classification Search ................ 324/600, 324/642, 76.11, 76.19
See application file for complete search history.

(56) References Cited

U.S. PATENT DOCUMENTS 7,122,965 B2 * 10/2006 Goodman .............. 315/111.21

2003/0178140 A1 * 9/2003 Hanazaki et al. ...... 156/345.28
2003/0184319 A1 * 10/2003 Nishimori et al. .......... 324/684

FOREIGN PATENT DOCUMENTS

JP          5-63604         3/1993

* cited by examiner

*Primary Examiner*—Vincent Q. Nguyen
(74) *Attorney, Agent, or Firm*—Hamre, Schumann, Mueller & Larson, P.C.

(57) ABSTRACT

A high-frequency power source supplies high-frequency power to a load whose reflection characteristic for the power varies with time. The power source includes a frequency-variable power generator, a power detector for detecting the power into the load and the power from the load, a reflection coefficient calculator for calculating a reflection coefficient based on the detection of the power into and from the load, a frequency detector causing the power generator to generate high-frequency powers at various frequencies within a predetermined frequency range for obtaining the frequency that gives a minimum value to the calculated reflection coefficient, and a power supply controller for causing the power generator to generate a high-frequency power of the frequency obtained by the frequency detector and for supplying the high-frequency power to the load.

6 Claims, 8 Drawing Sheets

| Reflection Coefficient | Zone | Fluctuation Threshold Range |
|---|---|---|
| Large ↕ Small | A | ±10% |
| | B | ±50% |
| | C | ±100% |
| | D | ±250% |
| | E | ±500% |

HIGH-FREQUENCY POWER SOURCE

BACKGROUND OF THE INVENTION

1. Field of the Invention

The present invention relates to a high-frequency power source that supplies high-frequency electric power to a load such as a plasma processor for performing plasma etching in e.g. semiconductor wafer processing.

2. Description of the Related Art

FIG. 11 illustrates a conventional high-frequency power supply system disclosed in JP-A-H05-63604. The high-frequency power supply system includes a high-frequency power source 31 for outputting high-frequency power, and an impedance-matching unit 32, connected with the high-frequency power source 31 via e.g. a coaxial cable, for matching the input impedance of the high-frequency power source 31 with the load impedance. Further, the power supply system includes a load connecting section 33 and a load L. The connecting section 33, provided by e.g. a copper plate, is connected with the impedance-matching unit 32. The load L, e.g. a plasma processor, is connected with the load connecting section 33.

The high-frequency power source 31, an apparatus for supplying the load L with high-frequency power, includes components such as a power amplification circuit and an oscillation circuit, to output required electric power to the impedance-matching unit 32.

The impedance-matching unit 32 is configured to match the input impedance, i.e. an impedance viewed from the matching unit's inputting end toward the high-frequency power source 31, with the load impedance, i.e. an impedance viewed from the matching unit's inputting end toward the load L. The matching unit improves the efficiency in output supply from the high-frequency power source 31 to the load L.

The load L is operated to process works such as semiconductor wafers or liquid crystal substrates by means of etching, CVD, etc. As noted above, an example of the load L is a plasma processor (plasma chamber) comprising a vacuum container, in which a gas is introduced to generate plasma. The high-frequency power is used to ionize the gas to generate plasma. The plasma thus obtained is used to process works such as semiconductor wafers and liquid crystal substrates.

Now, the load L has a characteristic in terms of the relationship between the output frequency f of the high-frequency power and the reflection coefficient Γ (or impedance). Specifically, as shown in FIG. 12, the reflection coefficient Γ takes a minimum value Γs at a certain output frequency fs. Further, the value changes frequently with time in the load L, due to changes in the load such as the gas sealed in the plasma processor, the pressure inside the plasma processor and so on, as indicated in a phantom line in FIG. 12. More specifically, the output frequency f at which the reflection coefficient Γ takes a minimum value shifts to an output frequency fs', with a minimum reflection coefficient being Γs'.

The impedance-matching unit 32 shown in FIG. 11 includes: a matching circuit built with inductors L1, L2 and variable capacitors C1, C2 serving as impedance varying devices; a detector (not illustrated) which detects the high-frequency voltage V, the high-frequency current I, and the phase difference θ between the high-frequency voltage V and the high-frequency current I; and a control circuit (not illustrated) for adjusting capacitance values of the variable capacitors C1, C2. The control circuit outputs a control signal, based on which electric motors (not illustrated) are driven to adjust capacitance of the variable capacitors C1, C2.

The detector detects the high-frequency voltage V, the high-frequency current I and the phase difference θ between the voltage V and the current I. Then, these values are inputted to the control circuit, and the control circuit calculates the input impedance Z1 of the impedance-matching unit 32 based on these inputs. Based on the input impedance Z1 and impedance values Zc1, Zc2 of the variable capacitors C1, C2, the control circuit calculates the load-circuit impedance Z2 which is the impedance viewed from the output terminal of the impedance-matching unit 32 toward the load L.

Then, based on the calculated load-circuit impedance Z2, the control circuit makes adjustment on the variable capacitors C1, C2 so that the input impedance Z1 will match the output impedance Zs (e.g. 50Ω) of the high frequency power source 31, thereby matching the impedances between the high frequency power source 31 and the load L.

There is a problem, however, that it takes time, e.g. one second or so, for the impedance-matching unit 32 to complete the impedance matching operation. On the contrary, the minimum value in the reflection coefficient and the corresponding output frequency changes instantaneously in the load L. Thus, the impedance-matching unit 32 is not suitable for such an apparatus. Further, in the impedance-matching unit 32, impedance matching by adjusting capacitance values of the variable capacitors C1, C2 is accomplished by driving electric motors. Due to the moving parts of the motors, the impedance-matching unit 32 does not have a high level of maintainability and also is susceptible to breakdown. As another problem, the impedance-matching unit 32 is costly.

SUMMARY OF THE INVENTION

The present invention has been proposed under the above-described circumstances. It is therefore an object of the present invention to provide a high-frequency power source which obtains the output frequency of the high-frequency power that gives a minimum reflection coefficient quickly, adjusts the power to the obtained high frequency, and outputs the adjusted high-frequency power.

A high-frequency power source provided by the present invention is for supplying high-frequency power to a load in which a reflection characteristic of the high-frequency power fluctuates with time. The power source includes: a frequency-variable power generator for generating the high-frequency power; a power detector for detecting a high-frequency power which goes into the load and a high-frequency power which is reflected by the load; reflection coefficient calculator for calculating a reflection coefficient based on the detection by the power detector of the power which goes into the load and the power which is reflected by the load; a frequency detector causing the power generator to generate the high-frequency powers at various frequencies within a predetermined frequency range for obtaining a frequency that gives a minimum value to the reflection coefficient calculated by the reflection coefficient calculator; and a power supply controller for causing the power generator to generate a high-frequency power of the frequency obtained by the frequency detector and supplying the high-frequency power to the load.

With the above constitution, the load has a reflection characteristic that high-frequency power supplied at an output frequency is reflected at a rate which fluctuates with time. For this load, there is obtained an output frequency at which the reflection coefficient takes a minimum value, within a preset frequency range. Then, high-frequency power of the obtained output frequency is supplied to the load. Therefore, it is possible to obtain an output frequency at which the reflection coefficient takes a minimum value more quickly than other methods such as a scanning method in which scanning is made constantly to output frequencies, and measurement is made for a reflection coefficient at each scanned output frequency, to obtain the smallest reflection coefficient from the measured reflection coefficients and then a corresponding output frequency to the smallest reflection coefficient. Furthermore, with a minimum value of the reflection coefficient fluctuating with time in the load, the present invention enables to follow the fluctuation quickly.

Preferably, in the high-frequency power source, the frequency detector includes: detection range setting unit for setting a detection range which is narrower than the above-described frequency range, for a predetermined initial frequency selected within the above-described frequency range; a frequency setting unit for setting two frequencies within the detection range set by the detection range setting unit; a frequency determining unit for causing the power generator to generate high-frequency powers at the two frequencies set by the frequency setting unit, and selecting one from the two frequencies whose reflection coefficient is smaller than the other, based on the reflection coefficients calculated by the reflection coefficient calculator; and a detection process controller for repeating a cycle of: setting the detection range by the detection range setting unit for a frequency determined by the frequency determining unit; setting the two frequencies by the frequency setting unit; and selecting a frequency having a smaller reflection coefficient, by the frequency determining unit.

Preferably, in the high-frequency power source, the two frequencies set by the frequency setting unit divide the detection range into three regions at a predetermined ratio.

Preferably, in the high-frequency power source, the detection range setting unit sets a different detection range from the detection range set in a previous cycle of the detection process, in a second and the following cycles of the detection process performed by the detection process controller.

Further, preferably, the high-frequency power source further includes: a fluctuation threshold range determining unit for determining a fluctuation threshold range for a reflection coefficient at a frequency obtained by the frequency detector; a reflection coefficient monitor for causing the reflection coefficient calculator to calculate a reflection coefficient at a predetermined interval when the power supply controller is controlling the frequency of high-frequency power; a reflection coefficient determining means for determining whether or not the reflection coefficient calculated by the reflection coefficient calculator is out of the fluctuation threshold range; and a frequency detection controller for maintaining the frequency of the high-frequency power generated by the power generator at the frequency obtained by the frequency detector if the determining means determines that the reflection coefficient is not out of the fluctuation threshold range, while causing the frequency detector to re-detect a frequency that minimizes the reflection coefficient if the determining means determines that the reflection coefficient is out of the fluctuation threshold range.

Further, preferably, in the high-frequency power source, the fluctuation threshold range is preset according to a value of reflection coefficient at a frequency to be obtained by the frequency determining unit. The smaller the value of the reflection coefficient, the wider is a baseline width of the range.

Other characteristics and advantages of the present invention will become clearer from the following detailed description to be made with reference to the attached drawings.

DETAILED DESCRIPTION OF THE PREFERRED EMBODIMENTS

Preferred embodiments of the present invention will now be described below with reference to the accompanying drawings.

Figure 1:
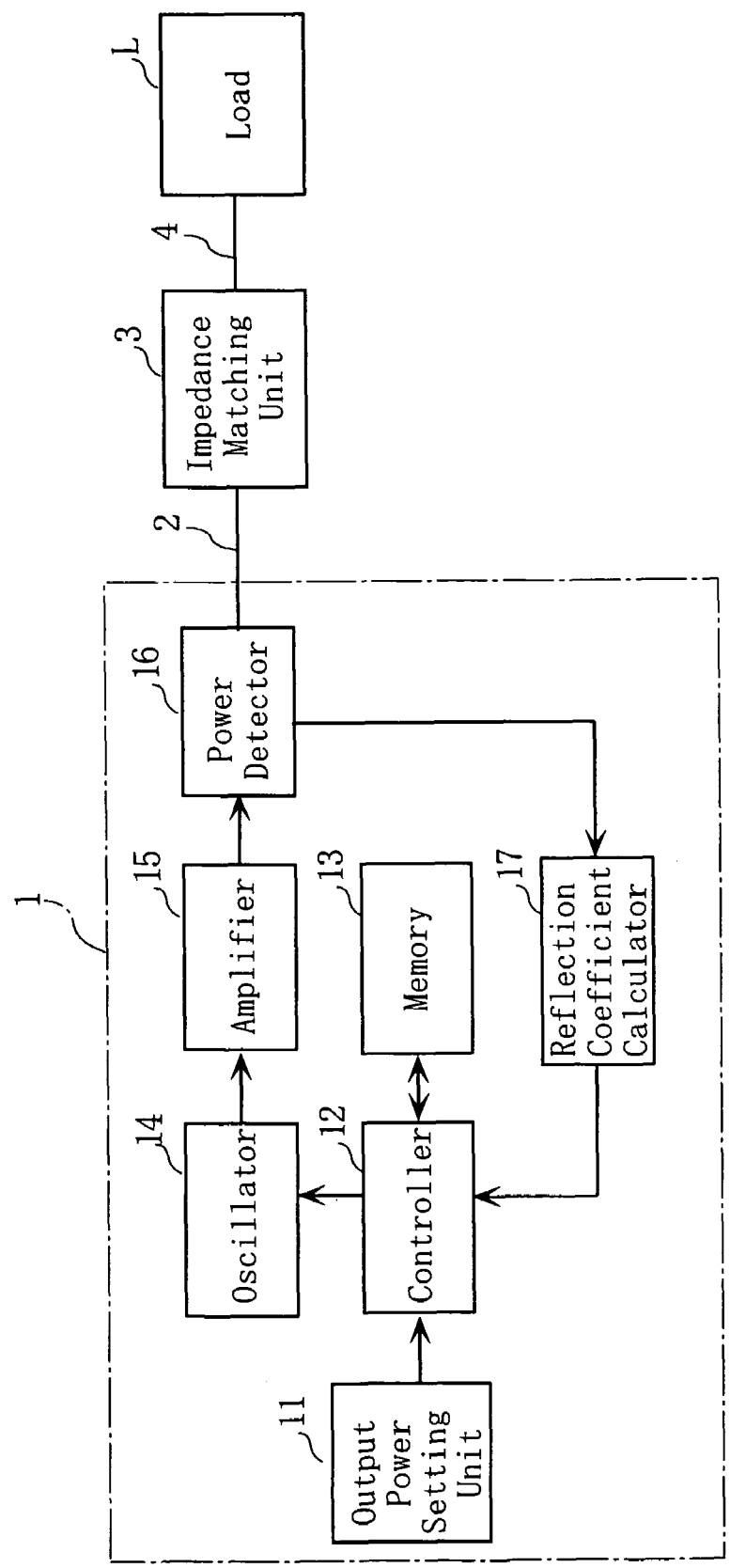
FIG. 1 is a configuration chart of a high-frequency power supply system to which a high-frequency power source according to the present invention is applied.

FIG. 1 shows a high-frequency power supply system embodying a high frequency power source according to the present invention. The high-frequency power supply system supplies high-frequency power necessary for performing the processing (e.g. plasma etching) of works such as semiconductor wafers and liquid crystal substrates. The high-frequency power supply system includes a high-frequency power source 1, a transmission line 2, an impedance-matching unit 3, a load connecting section 4 and a load L.

The high-frequency power source 1 is connected with the impedance-matching unit 3 via the transmission line 2 which may be a coaxial cable, for example. The impedance-matching unit 3 is connected with the load connecting section 4, which may be a copper plate properly shielded for preventing leakage of electromagnetic waves. The load connecting section 4 is connected with the load L.

The high-frequency power source 1 is an apparatus for supplying the load L with high-frequency power of a frequency not lower than e.g. a few hundreds of kHz. More details of the high-frequency power source 1 will be described later.

The impedance-matching unit 3, which matches the impedance of the high-frequency power source 1 with the impedance of the load L, includes impedance components such as capacitors and inductors. Specifically, assuming that the impedance viewed from the output terminal of the high-frequency power source 1 toward the high-frequency power source 1 ("output impedance") is 50Ω, and that the high-frequency power source 1 is connected with the input terminal of the impedance-matching unit 3 via a transmission line 2 having a characteristic impedance of 50Ω, the impedance-matching unit 3 adjusts the impedance viewed from the input terminal of the impedance-matching unit 3 toward the load L to 50Ω.

The load L or plasma processor (plasma chamber) for processing works by means of etching, CVD, etc. The plasma processor provides a variety of processing environments depending on the purpose of process performed to the work. For example, when etching a work, the etching process is performed using an appropriate gas suitable for the etching, at an appropriate gas pressure, at an appropriate electric power value of the high-frequency power, and a supply time of the high-frequency power. In the plasma processing, a work is placed in a container (not illustrated), into which a plasma discharge gas such as nitrogen gas and argon gas is introduced. As high-frequency power is supplied, an electric voltage is applied between two terminals in the container. The applied voltage causes the plasma discharge gas to discharge, turning the gas from non-plasma state into plasma state. The work is processed using the plasma gas.

Figure 12:
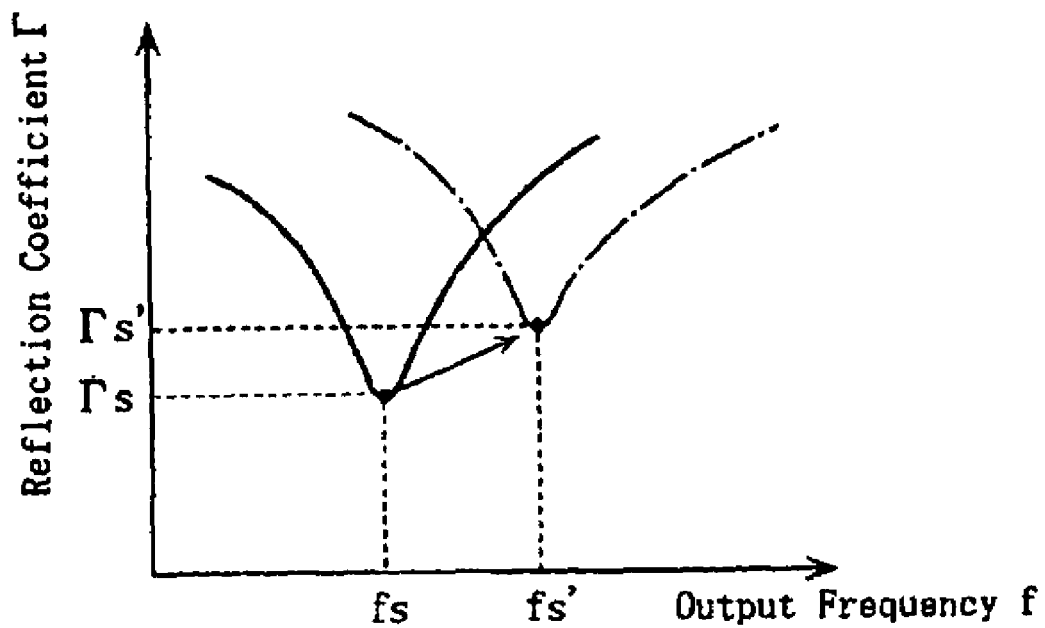
FIG. 12 is a characteristic chart of an output frequency and a reflection coefficient.

The high-frequency power source 1 in the illustrated embodiment is capable of adjustably changing the frequency of the power to be supplied to the load L. As described earlier with reference to FIG. 12, the reflection coefficient fluctuates with time in the load L, depending upon the output frequency of the power. The high-frequency power source 1 is configured to obtain the changing value of the reflection coefficient at regular intervals. Based on the obtained information, the power source 1 adjusts the output frequency of the power so that the reflection coefficient is minimized, and then outputs the adjusted high-frequency power to the load L. In this manner, appropriate energy is supplied to the load L.

As shown in FIG. 1, the high-frequency power source 1 includes an output power setting unit 11, a controller 12, a memory 13, an oscillator 14, an amplifier 15, a power detector 16 and a reflection coefficient calculator 17.

Through the output power setting unit 11, the user can adjust the high-frequency power to be outputted to the load L. Though not illustrated in FIG. 1, the output power setting unit 11 includes an operation section which is provided with: an output power setting switch for setting an output value of the high-frequency power; an output start switch for starting the high-frequency power supply; and a frequency setting switch for setting a reference output frequency f0 which is used in a detection process to be described later. Data about the high-frequency power output value and the reference output frequency f0 arranged by the output power setting unit 11 are outputted to the controller 12.

The controller 12, serving as the control hub in the high-frequency power source 1, makes a search based on the reflection coefficient calculated by the reflection coefficient calculator 17 and obtains an output frequency at which the reflection coefficient takes a minimum value. Further, when the reflection coefficient varies due to the change of the output frequency, the controller follows the change to obtain a new output frequency which gives a minimum value to the reflection coefficient. The controller also adjusts the high-frequency power based on the output frequency obtained through the search function and the chase function.

In the load L, as described earlier, the output frequency causing the minimum value of the reflection coefficient shifts with time. If the high-frequency power supply to the load L is conducted at a constant output frequency, the reflection coefficient increases to a point where the energy is not supplied properly to the load L, causing no plasma to be generated in the load L. Therefore, the controller 12 constantly tracks the particular frequency at which the reflection coefficient takes the minimum value, and supplies the optimized high-frequency power (i.e. the power of the particular frequency) to the load L. In this manner, the load L generates and maintains the appropriate state of plasma.

The controller 12 is connected with the memory 13. The memory 13 stores control programs to track the high-frequency power output frequency that minimizes the reflection coefficient and to adjust the high-frequency power to this output frequency. The memory 13 also stores variable data such as reflection coefficient values which are calculated by the reflection coefficient calculator 17 or obtained in the detection process. Further, the memory 13 also stores data on a fluctuation threshold range which provides a determination criterion about whether or not to perform the tracking for the minimum value of the reflection coefficient acquired in the detection process.

The oscillator 14 provides oscillations that can be varied in accordance with the control signal from the controller 12. Specifically, when the system finds it needed to adjust the output frequency through the above-described detection process and the tracking process, the controller 12 sends a control signal to the oscillator 14 to adjust the output frequency. The oscillator then changes the output frequency of its oscillation output, and outputs the frequency as an oscillation output signal to the amplifier 15.

The amplifier 15 amplifies the oscillation output signal from the oscillator 14 and outputs the high-frequency power. The oscillation output signal which is amplified by the amplifier 15 is outputted to the impedance-matching unit 3 via the power detector 16.

The power detector 16 detects the high-frequency power outputted by the amplifier 15, and is provided by e.g. a directional coupler. The power detector 16 separates a high-frequency wave traveling from the amplifier 15 to the load L (hereinafter called progressive wave) and a high-frequency wave reflecting from the load L (hereinafter called reflected wave), and detects a power value of each. The power value of progressive wave and the power value of reflected wave detected by the power detector 16 are outputted to the reflection coefficient calculator 17.

The reflection coefficient calculator 17 calculates a reflection coefficient $\Gamma$ based on the power value of progressive wave and the power value of reflected wave inputted from the power detector 16. The reflection coefficient $\Gamma$ can be calculated by obtaining the rate of progressive wave power Pf to the reflected wave power Pr, i.e. by obtaining Pr/Pf. The calculated value of the reflection coefficient $\Gamma$ is then outputted regularly to the controller 12, in response to a timer interrupt signal from the controller 12.

Figure 2:
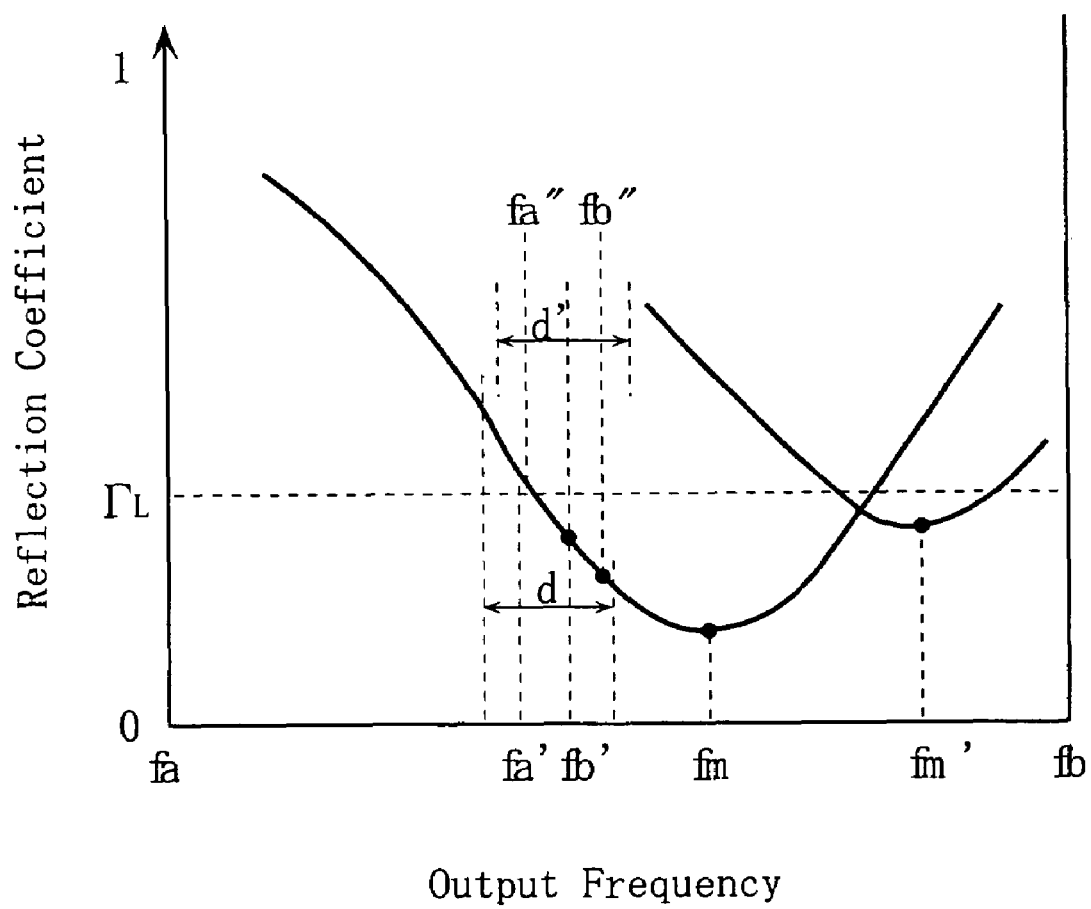
FIG. 2 outlines a control operation of the high-frequency power source.

The high-frequency power source 1 obtains an output frequency fm that minimizes the reflection coefficient by utilizing a method as shown in FIG. 2. Specifically, a detection range d which is narrower than a predetermined frequency range fa-fb is set. Then, within the detection range d, two output frequencies fa', fb' are selected, to check the reflection coefficient for each of the output frequencies fa', fb', and pick up a smaller output frequency fb'. Next, a new detection range d' is set, with the picked output frequency fb' at the center. Then, within the new detection range d', two output frequencies fa", fb" are selected, to check the reflection coefficient for each of the output frequencies fa", fb", and pick up a smaller output frequency fb". This cycle is repeated while changing the detection range, until the output frequency fm that minimizes the reflection coefficient is found.

Now there is found an output frequency fm that minimizes the reflection coefficient, and sometime thereafter, the reflection characteristic changes, and the value of output frequency fm at this particular reflection coefficient becomes out of a predetermined threshold value $\Gamma_L$. Then, a new output frequency fm' that minimizes the reflection coefficient is found by doing the tracking process, i.e. by repeating the above-described cycle.

Figure 3:
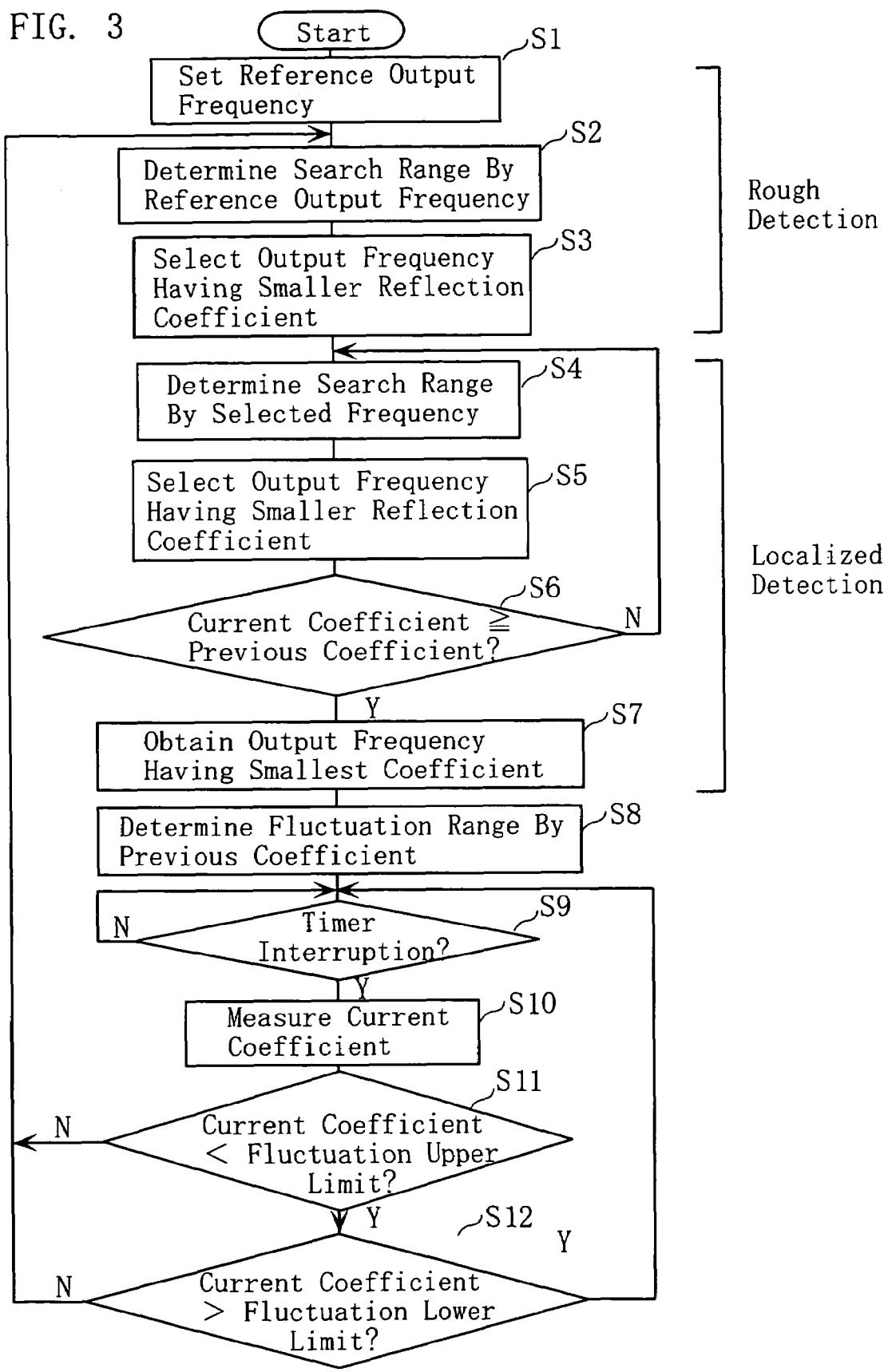
FIG. 3 is a flowchart showing a control operation of the high-frequency power source.

Now, description will be made for a specific control operation according to the above-described method with reference to a flowchart in FIG. 3. In the control operation, first a detection process is made for detecting and obtaining a high-frequency power output frequency that minimizes the reflection coefficient. Thereafter, when the value of the reflection coefficient changes, a tracking process is made for tracking the value of reflection coefficient, to obtain a new output frequency at which the reflection coefficient takes a minimum value. The output of the high-frequency power is adjusted to the obtained output frequency, and is supplied to the load L.

First, the user sets on the output power setting unit 11 a reference output frequency f0 which is used as a baseline in the detection processes for the high-frequency power output level and the high-frequency power output frequency, within a predetermined frequency range fa-fb (e.g. 13 MHz-14 MHz) (S1). The value set for the baseline output frequency f0 is e.g. 13.56 MHz, which is a value used as a standard output frequency to the load L or a plasma processor. Note, however, that the value for the baseline output frequency f0 is not limited to this, and whatsoever else.

Figure 4:
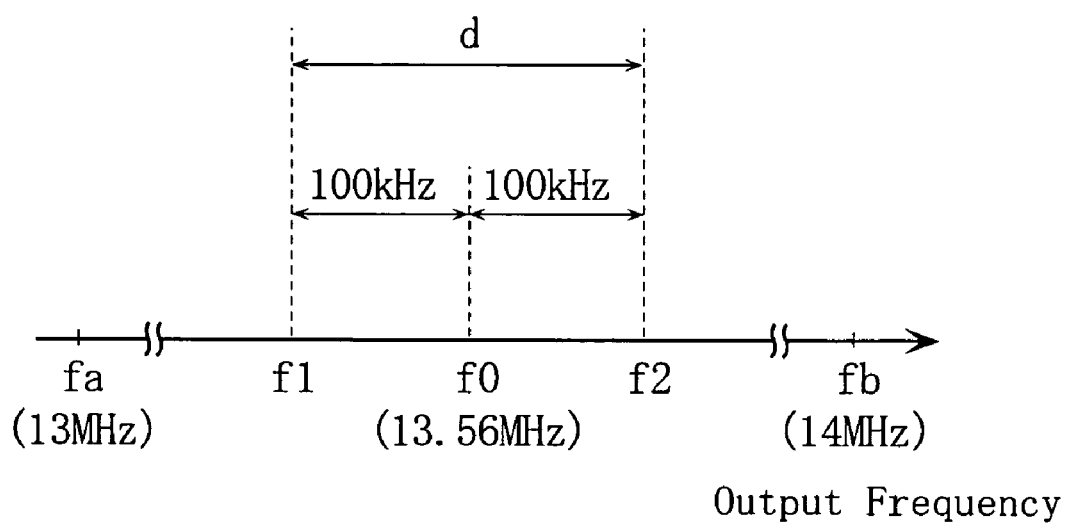
FIG. 4 illustrates a baseline output frequency and a detection range.

Next, a preliminary detection process (hereinafter called "rough detection process") is performed for finding an approximate value of output frequency that will minimize the reflection coefficient. Specifically, as shown in FIG. 4, a detection range d (from an output frequency f1 through an output frequency f2) is set which is centered around the given, user-selected baseline output frequency f0 (e.g. 13.56 MHz) and is narrower than a predetermined frequency range fa-fb (S2).

As an example, the detection range d in this case is centered at the baseline output frequency f0 and spans to ±100 kHz kHz. As may be noticed, the detection range d is relatively narrow for the predetermined frequency range fa-fb, because in plasma processors, there is a certain range (frequency range) of the high-frequency power output in which any output frequency will cease the plasma, and it is important to minimize the risk that the detection range d will overlap this plasma-vanishing range.

Figure 5:
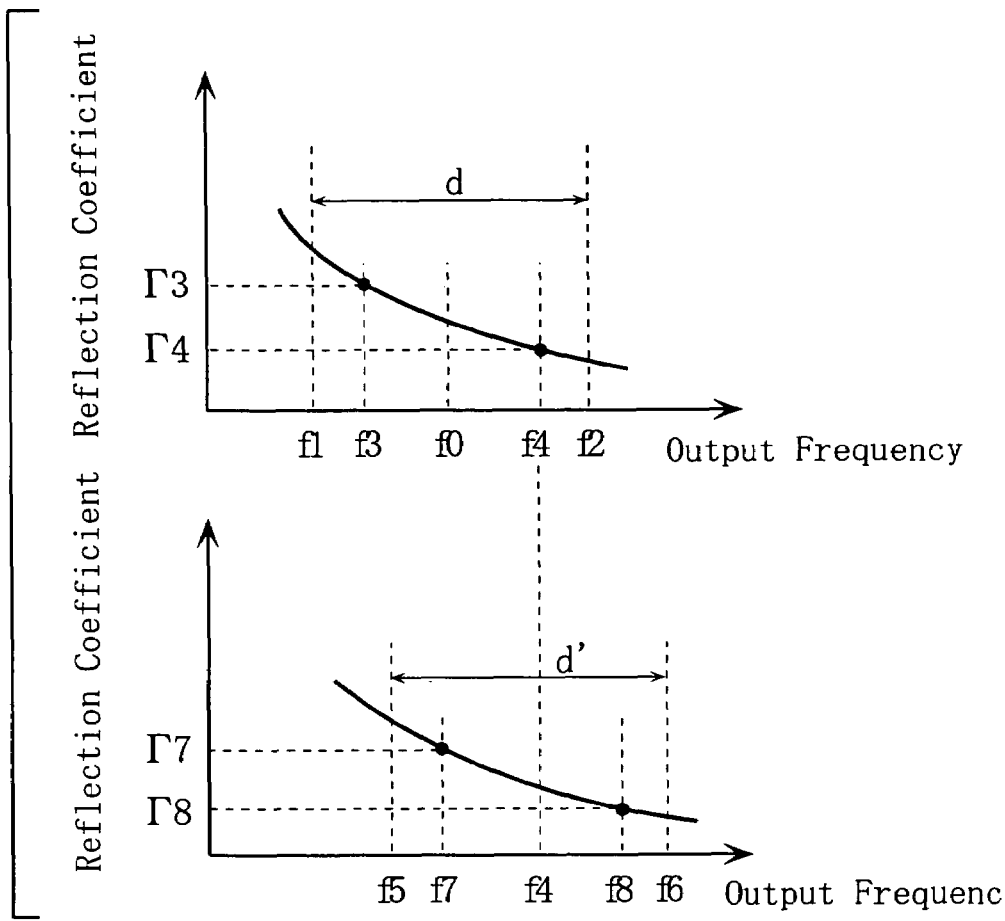
FIG. 5 illustrates a rough detection process and a localized detection process.

Next, two output frequencies f3, f4 within the detection range d are selected by using golden section method for example (See FIG. 5, the upper graph). Measurements are made for reflection coefficients $\Gamma 3$, $\Gamma 4$ at the output frequencies f3, f4, then a smaller one of the reflection coefficients $\Gamma 3$, $\Gamma 4$ is chosen (In FIG. 5, $\Gamma 4$ is the smaller one), and the output frequency at the chosen reflection coefficient is picked (In FIG. 5, f4 is picked)(S3).

Specifically, the controller 12 outputs a control signal to the oscillator 14 for outputting a high-frequency power at the output frequency f3. The oscillator 14 outputs an oscillation output signal to the amplifier 15 for outputting the power at the output frequency f3. The amplifier 15 outputs a high-frequency power at the output frequency f3 to the load L. Based on the outputted high-frequency power, the power detector 16 detects a progressive wave power and a reflected wave power, and outputs the detected values to the reflection coefficient calculator 17. Based on the power values of the progressive wave power and the reflected wave power, the reflection coefficient calculator 17 calculates a reflection coefficient $\Gamma 3$, and outputs it to the controller 12. Through this routine, the controller 12 obtains the reflection coefficient $\Gamma 3$ at the output frequency f3.

Likewise, the controller 12 outputs a control signal to the oscillator 14 for outputting a high-frequency power at the output frequency f4, thereby obtains the reflection coefficient $\Gamma 4$ at the output frequency f4. Then, out of the two reflection coefficients $\Gamma 3$, $\Gamma 4$, the smaller one, i.e. the reflection coefficient $\Gamma 4$ is chosen, and the chosen reflection coefficient $\Gamma 4$ and the corresponding output frequency f4 are stored in the memory 13. It should be noted that the golden section method is not the only method for setting two output frequencies f3, f4 in the detection range d.

Next, the controller 12 performs a detection process for detecting a minimum value of the reflection coefficient based on the obtained output frequency (hereinafter called "localized detection process"). Now, continue with the same example that the rough detection process has yielded the output frequency f4. As shown FIG. 5, in the localized detection process, the output frequency f4 is set as the center of the detection range, and determines a predetermined span of detection range d' (from an output frequency f5 through an output frequency f6) which is centered around the output frequency f4 (S4). In this case, a rule-of-thumb value is used as the span for the detection range d', which may be the same span as used in Step S2 (i.e. ±100 kHz), or the span may be a value obtained by multiplying the span used in Step S2 with a certain constant.

Once the detection range d' is determined, two output frequencies f7, f8 are selected within the detection range d' using e.g. golden section method, and an output frequency which has a smaller reflection coefficient (i.e. f8 in FIG. 5) is obtained (S5). The value of the output frequency f8 and the reflection coefficient $\Gamma 8$ at this particular output frequency are stored in the memory 13.

Figure 6:
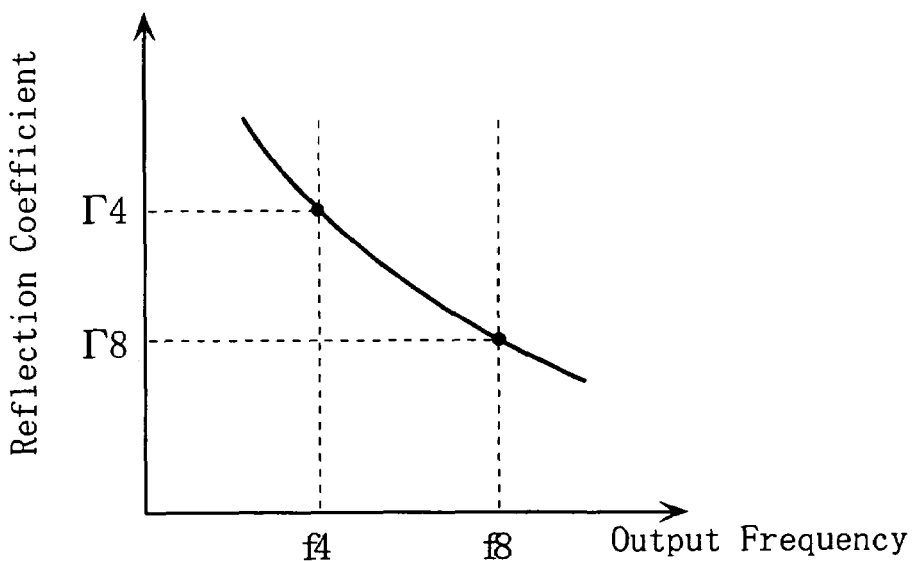
FIG. 6 is a characteristic chart of an output frequency and a reflection coefficient when the localized detection process is made again.

Next, comparison is made between the reflection coefficient $\Gamma 8$ at the output frequency f8 and the reflection coefficient $\Gamma 4$ at the output frequency f4 which was obtained in the previous detection process, to determine which is larger (S6). If the reflection coefficient $\Gamma 4$ which was obtained in the previous detection process is greater than the reflection coefficient $\Gamma 8$ which is obtained in the current detection process (S6: NO), the program goes back to Step S4, to do a further cycle of the localized detection process. Specifically, as shown in FIG. 6, this state is a state in which the currently obtained reflection coefficient $\Gamma 8$ is smaller than the previously obtained reflection coefficient $\Gamma 4$. In other words, a minimum value of the reflection coefficient should be smaller than the currently obtained reflection coefficient $\Gamma 8$, so in this case, the search for the minimum reflection coefficient is continued by further performing a localized detection process. Note that in this localized detection process, the currently obtained output frequency f8 is used as the baseline output frequency.

On the other hand, if the reflection coefficient $\Gamma 4$ which was obtained in the previous detection process is smaller than the reflection coefficient $\Gamma 8$ which is obtained in the current detection process, or if the reflection coefficient $\Gamma 4$ has the same value as the reflection coefficient $\Gamma 8$ (S6: YES), the program goes to Step S7. Specifically, as shown FIG. 7, this state is a state in which the currently obtained reflection coefficient Γ4 is smaller than or equal to the previously obtained reflection coefficient Γ8. In other words, the previously obtained reflection coefficient Γ4 is the minimum value of the reflection coefficient. In this way, the reflection coefficient Γ4 is obtained as the minimum value within the detection range (S7).

Next, Step S8 determines a fluctuation threshold range based on the reflection coefficient Γ4 which was found and obtained as a minimum value in the previous detection process. Once the reflection coefficient has changed, the fluctuation threshold range serves as a decision criterion on whether or not to track the fluctuating reflection coefficient.

Figures 7, 8:
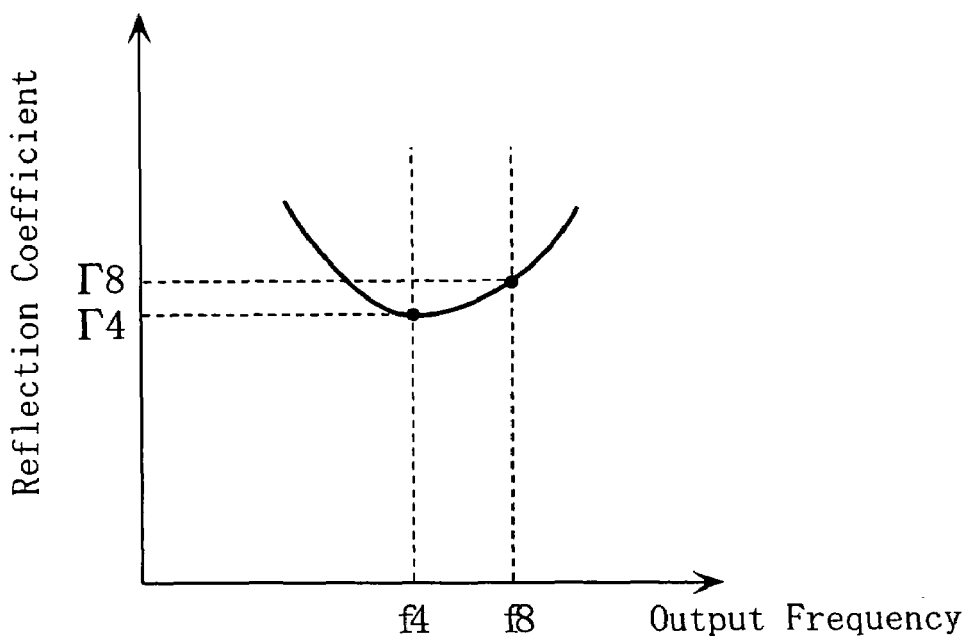
FIG. 7 is a characteristic chart of an output frequency and a reflection coefficient at a time when a minimum value is obtained for the reflection coefficient.
FIG. 8 shows a table, as an example, of a fluctuation threshold range set for each zone.
Figure 9:
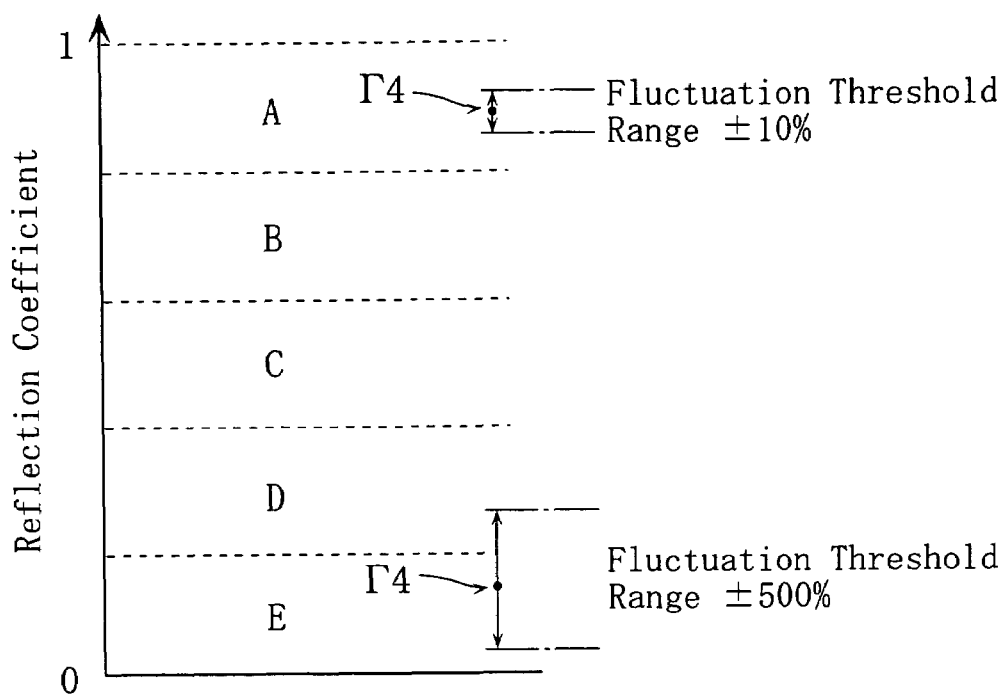
FIG. 9 shows a relationship between the zone and the fluctuation threshold range.

Hereinafter, description will cover how the fluctuation threshold range is determined. FIG. 8 is a table of fluctuation threshold ranges stored in e.g. the memory 13. In FIG. 8, reflection coefficients are grouped in a plurality of zones according to their values, and each zone is given a predetermined fluctuation threshold range which differs from other zones. The larger is the value of reflection coefficient in the zone, the narrower fluctuation threshold range is given to that zone. For example, as shown FIG. 9, if an obtained minimum reflection coefficient Γ4 belongs to Zone A, the fluctuation threshold range set for the reflection coefficient Γ4 will be ±10% for example. Likewise, if an obtained minimum reflection coefficient Γ4 belongs to Zone E, the fluctuation threshold range set for the reflection coefficient Γ4 will be ±500% for example.

With this arrangement, once a reflection coefficient Γ4 which is in Zone A and fluctuates with time has its value getting out of its ±10% range, a tracking process is performed to track the reflection coefficient. Likewise, once a reflection coefficient Γ4 which is in Zone E and fluctuates with time has its value getting out of its ±500% range, a tracking process is performed to track the reflection coefficient.

As described above, a different span is given to the fluctuation threshold range according to the size of the reflection coefficient. This is advantageous in avoiding the following situations for example: Imagine that all of the zones have the same span for the fluctuation threshold range, and the reflection coefficient is small. If the fluctuation threshold range set for the coefficient is small, the tracking process will have to be made frequently. However, when the reflection coefficient is small, load status is relatively stable and so making the tracking process for a small amount of change does not make much sense. Conversely, if the reflection coefficient is large and if the fluctuation threshold range set for the coefficient is large, the tracking process will not be made as frequently. However, when the reflection coefficient is large, its value fluctuation is rough and so the change has to be grasped appropriately.

Figure 10:
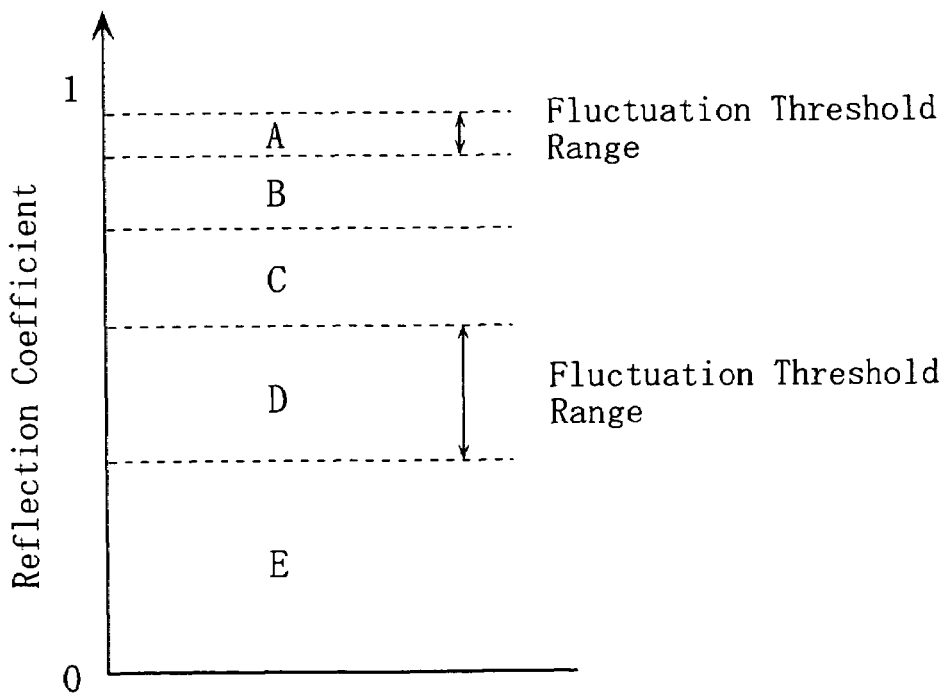
FIG. 10 shows another relationship between the zone and the fluctuation threshold range.
Figure 11:
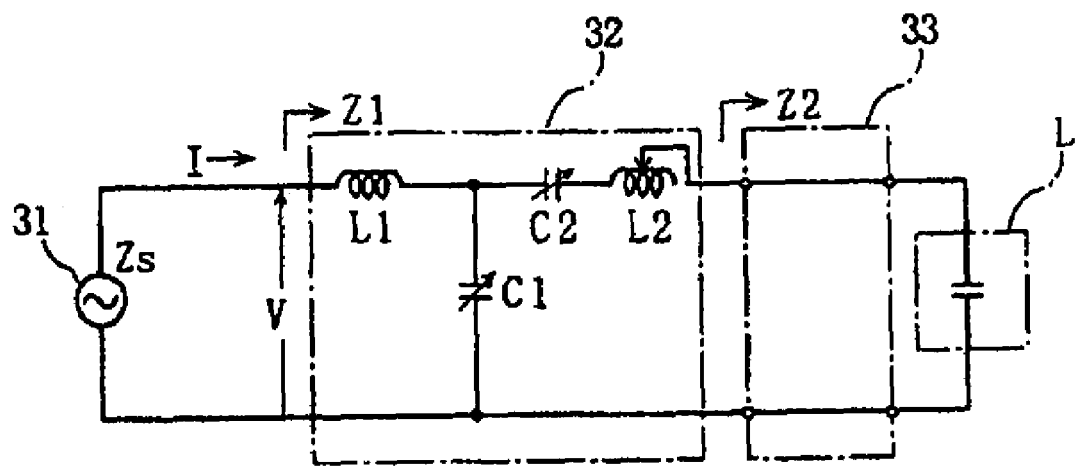
FIG. 11 is a configuration chart of a conventional high-frequency power supply system.

It should be noted that the number of the zones is not limited to the number shown in the table in FIG. 8. Further, the fluctuation threshold range may be as shown in FIG. 10; specifically, the grouping is made according to the absolute value of the reflection coefficient, and the larger is the absolute value of reflection coefficient, the narrower is the fluctuation threshold range.

Returning to FIG. 2, the controller 12 checks the reflection coefficient periodically, to see if the reflection coefficient is within the given fluctuation threshold range or not. Specifically, the controller 12 outputs a timer interrupt signal to the reflection coefficient calculator 17 (S9). Upon the timer interruption, a value of the reflection coefficient Γc calculated by the reflection coefficient calculator 17 is acquired (S10). Specifically, the acquired value of the reflection coefficient Γc is a current measurement of the reflection coefficient. Then, the acquired reflection coefficient Γc is compared with an upper limit value Γu of the fluctuation threshold range for the reflection coefficient set in Step S8, to see if the acquired reflection coefficient Γc has a value smaller than the upper limit value Γu of the fluctuation threshold range (S11).

If the acquired reflection coefficient Γc has a value smaller than the upper limit value Γu of the fluctuation threshold range (S11: YES), then the acquired reflection coefficient Γc is compared with a lower limit value Γd of the fluctuation threshold range for the reflection coefficient set in Step S8, to see if the acquired reflection coefficient Γc has a value greater than the lower limit value Γd of the fluctuation threshold range (S12). If the acquired reflection coefficient Γc has a value greater than the lower limit value Γd of the fluctuation threshold range (S12: YES), the program goes back to Step S9, where the reflection coefficient is checked periodically to see if it has gone beyond the fluctuation threshold range. Specifically, this state is a state where the reflection coefficient fluctuates mildly within the fluctuation threshold range.

On the other hand, there is a case where the acquired reflection coefficient Γc has a value greater than the upper limit value Γu of the fluctuation threshold range (S11: NO), i.e. the reflection coefficient has moved to have a bigger value. In this case, the program goes back to Step S2 to perform a rough detection process: Specifically, a new cycle of obtaining an output frequency at which the reflection coefficient takes a minimum value is performed by first setting a detection range d centering around the output frequency of the acquired reflection coefficient Γc as the baseline output frequency f0.

The program also goes back to Step S2 to perform a rough detection process again, when the acquired reflection coefficient Γc has a value not greater than the upper limit value Γu of the fluctuation threshold range (S11: YES), but the acquired reflection coefficient Γc has a value smaller than the lower limit value Γd of the fluctuation threshold range (S12: NO), i.e. in the case where the reflection coefficient has moved to have a smaller value.

Thereafter, the above-described rough detection process and the localized detection process are repeated to track the constantly changing output frequency at which the reflection coefficient takes a minimum value. The rough detection process and the localized detection process performed when the reflection coefficient Γc has a value out of the fluctuation threshold range work as a tracking process for tracking the changing output frequency at which the reflection coefficient takes a minimum value. According to this process, it is always possible to obtain an output frequency at which the reflection coefficient takes a minimum value, and to supply appropriate high-frequency power to the load L in which plasma is being generated.

The output frequency at which the reflection coefficient takes a minimum value can be detected differently. For example, scanning is made to output frequencies at a predetermined interval within a predetermined frequency range, and a measurement is made for a reflection coefficient at each scanned output frequency, to obtain the smallest reflection coefficient and a corresponding output frequency to the smallest reflection coefficient, from the measured reflection coefficients.

However, according to this method, scanning is made at a predetermined interval and a reflection coefficient is obtained at the predetermined interval. This is disadvantageous since it takes time, and it is difficult to make processing quickly in response to the changing reflection coefficient. On the contrary, according to the detection method proposed in the present embodiment, it is possible to quickly obtain the minimum value of the changing reflection coefficient since a predetermined detection range is set and detection is made for the smallest reflection coefficient within the detection range.

The present invention being thus described, it is obvious that the same may be varied in many ways. Such variations are not to be regarded as a departure from the spirit and scope of the present invention, and all such modifications as would be obvious to those skilled in the art are intended to be included within the scope of the following claims.

The invention claimed is:

1. A high-frequency power source for supplying high-frequency power to a load in which a reflection characteristic for the high-frequency power varies with time, the power source comprising:
    a frequency-variable power generator for generating the high-frequency power;
    a power detector for detecting a high-frequency power which goes into the load and a high-frequency power which is reflected by the load;
    a reflection coefficient calculator for calculating a reflection coefficient based on the detection by the power detector of the power which goes into the load and the power which is reflected by the load;
    a power supply controller for causing the power generator to generate high-frequency powers at various frequencies within a predetermined frequency range for obtaining a frequency that gives a minimum value to the reflection coefficient calculated by the reflection coefficient calculator;
    the power supply controller also causing the power generator to generate a high-frequency power of the obtained frequency for supply to the load;
    wherein the power supply controller includes:
    a detection range setting unit for setting a detection range narrower than the predetermined frequency range, with respect to a predetermined initial frequency selected from the predetermined frequency range;
    a frequency setting unit for setting two frequencies within the detection range set by the detection range setting unit;
    a frequency determining unit for causing the power generator to generate high-frequency powers at the two frequencies set by the frequency setting unit, and selecting one from the two frequencies whose reflection coefficient is smaller than the other, based on the reflection coefficients calculated by the reflection coefficient calculator; and
    a detection process controller for repeating a cycle of: setting the detection range by the detection range setting unit for a frequency determined by the frequency determining unit; setting the two frequencies by the frequency setting unit; and selecting a frequency having a smaller reflection coefficient, by the frequency determining unit until a smallest reflection coefficient is found.

2. The high-frequency power source according to claim 1, wherein the two frequencies set by the frequency setting unit divide the detection range into three regions.

3. The high-frequency power source according to claim 1, wherein the detection range setting unit sets different detection ranges for a current detection process and a previous detection process when frequency detection is performed repeatedly by the detection process controller.

4. The high-frequency power source according to claim 2, wherein the detection range setting unit sets different detection ranges for a current detection process and a previous detection process when frequency detection is performed repeatedly by the detection process controller.

5. The high-frequency power source according to claim 1, further comprising:
    a fluctuation threshold range determining unit for determining a fluctuation threshold range for a reflection coefficient at a frequency obtained by the frequency detector;
    a reflection coefficient monitor for causing the reflection coefficient calculator to calculate a reflection coefficient at a predetermined interval when the power supply controller is controlling the frequency of high-frequency power;
    a judging unit for determining whether or not the reflection coefficient calculated by the reflection coefficient calculator is out of the fluctuation threshold range; and
    a frequency detection controller for causing the frequency of the high-frequency power generated by the power generator to be maintained at the frequency obtained by the frequency detector when the judging unit determines that the reflection coefficient is not out of the fluctuation threshold range, the frequency detection controller causing the frequency detector to re-detect a frequency that minimizes the reflection coefficient when the judging unit determines that the reflection coefficient is out of the fluctuation threshold range.

6. The high-frequency power source according to claim 5, wherein the fluctuation threshold range is preset according to a value of reflection coefficient at a frequency obtained by the frequency determining unit, the fluctuation threshold range being wider as the reflection coefficient is smaller.

* * * * *